(12) United States Patent
Tsai et al.

(10) Patent No.: US 7,096,439 B2
(45) Date of Patent: Aug. 22, 2006

(54) SYSTEM AND METHOD FOR PERFORMING INTELLECTUAL PROPERTY MERGE

(75) Inventors: Cheng Mao Tsai, Hsin-chu (TW); Hung-Yih Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 343 days.

(21) Appl. No.: 10/442,769

(22) Filed: May 21, 2003

(65) Prior Publication Data

US 2004/0237054 A1    Nov. 25, 2004

(51) Int. Cl.
*G06F 17/50* (2006.01)
(52) U.S. Cl. .................. 716/5; 716/4; 716/1
(58) Field of Classification Search .......... 716/5, 716/4, 1
See application file for complete search history.

(56) References Cited

U.S. PATENT DOCUMENTS

| | | | | |
|---|---|---|---|---|
| 5,416,842 | A * | 5/1995 | Aziz | 380/30 |
| 6,038,597 | A * | 3/2000 | Van Wyngarden | 709/219 |
| 6,539,533 | B1 * | 3/2003 | Brown et al. | 716/17 |
| 6,738,957 | B1 * | 5/2004 | Gont et al. | 716/11 |
| 6,885,901 | B1 * | 4/2005 | Tomii | 700/97 |
| 2002/0059053 | A1 * | 5/2002 | Akita | 703/13 |
| 2003/0028650 | A1 * | 2/2003 | Chen et al. | 709/229 |
| 2003/0208596 | A1 * | 11/2003 | Carolan et al. | 709/225 |

OTHER PUBLICATIONS

Levi, John, Project Manager, "Dreaming Up a New Methodology for Physical Migration," www.silicon-designs.comFeat_Art.asp, 5 pages, May 1, 2003.

Wan, Edward, Vice President, Worldwide Field Engineering UMC, "VSIA IP Tagging Standard, a Detection Mechanism," VSI Alliance, 12 pages, Oct. 25, 2000.

Mentor Graphics, Calibre® Verification & Manufacturability, www.mentor.com/calibre/datasheets/calibre/html/index.html, 4 pages, visited May 14, 2003.

Datasheet, "Virtuoso Chip Editor"Cadence Design Systems, Inc., 2 pages, Apr. 2003.

© 2003 Cadence Design Systems, Inc., Cadence Baseline Foundry Process Design Kits (PDK) www.cadence.com/datasheets/baseline.html, 3 pages, May 14, 2003.

Cadence Design Systems, "Virtuoso Layout Editor," www.cadence.com/products/veditor.html, 1 page, visited May 14, 2003.

Cadence Design Systems, "Virtuoso Composer," www.cadence.com/products/vcomposer.html, visited May 14, 2003.

Cadence Design Systems, "Virtuoso—XL Layout Editor," www.cadence.com/products/vlayout.html, 1 page, visited May 14, 2003.

* cited by examiner

*Primary Examiner*—Sun James Lin
(74) *Attorney, Agent, or Firm*—Duane Morris LLP; Steven E Koffs

(57) ABSTRACT

An intellectual property (IP) merge system includes first and second storage device portions, a graphical user interface server, and an IP server. A user inputs integrated circuit (IC) configuration information into the first storage device by way of a network. The second storage device portion stores cell library IP data. The graphical user interface server serves at least one page by way of the network. The page enables the user to request an IP merge operation based on the IC configuration information and the cell library IP data. The IP server performs the IP merge operation in response to the request by the user.

21 Claims, 4 Drawing Sheets

SYSTEM AND METHOD FOR PERFORMING INTELLECTUAL PROPERTY MERGE

FIELD OF THE INVENTION

The present invention relates to integrated circuit design generally, and more specifically to systems for integrating cell designs from an intellectual property cell library.

BACKGROUND OF THE INVENTION

To expedite the development of mask sets for fabricating integrated circuits (ICs), chip designers typically combine standard cells from cell libraries. These cell definitions are commonly referred to as "intellectual property," (IP). Cells may contain geometrical objects such as polygons (boundaries), paths, and other cells. Objects in the cell are assigned to "layers" of the design. Typically, the cell definitions (IP) are provided by a cell library (or IP) vendor. The IP vendor develops each cell separately with the expectation that IC layouts designed using the cell will meet specifications. For example, the Taiwan Semiconductor Manufacturing Company, Ltd. of Taipei, Taiwan, provides a GDSII cell library of over 550 standard cells for 0.13 micron technology.

The IC designer selects the cells it wishes to use in an IC layout to provide whatever structures are required for a particular application. Each cell has one or more connectivity targets, which are predetermined points used to connect the patterns in a pair of cells. The configuration of cells (defined by the selection of GDS and a SPICE netlist) is submitted to a routing program, which connects the target-containing patterns of the adjacent cells to form complete sets of patterns for each mask layer.

When a design incorporates two cells adjacent to each other in an IC layout, the router identifies the location of the connectivity target in each cell, and constructs a connecting path between the targets, comprising one or more line segments. This connecting path is incorporated into the IC layout, so that the mask constructed from the connected cells includes continuous circuit paths.

Subsequently, the IC layout is submitted for verification (for example, using a program such as Calibre, by Mentor Graphics of Wilsonville, Oreg.). In verification, compliance with design rules is checked. For example, the line spacing between each pair of adjacent lines is compared to the relevant minimum for that line. If the line spacing is less than the minimum required for the width of the merged line, a design rule violation is identified.

To prevent misappropriation of their IP, many IP providers do not release IP GDS to their licensees, the IC designers. Instead, the IP providers only release their IP GDS and SPICE netlist to IC foundries, with whom the designers contract to fabricate the ICs. The designers are the foundries' direct customers. The designers need to have the IP GDS "merged" and verified before generating the tapeout data (where tapeout contains the design information that meets all of the complex process-specific design rules, has been fully verified and is ready to be used to generate masks). If the IP provider only releases its IP to the foundry, the customer must send its GDS and SPICE netlist to the foundry. In some cases, the foundry engineers execute the GDS merge, layout verification and tapeout. In other cases, the customers (e.g., the designer) may use a "customer room" at the foundry to do the merge operations themselves.

If the foundry engineers perform the IP merge, the foundry must allocate an engineer for the project. This may create human resource conflicts, because the foundry does not normally have dedicated engineering staff devoted to executing IP merge operations. If errors or violations are detected during the IP merge, the foundry's engineer sends the results to the customer for confirmation. The customer may then make changes to the design. This may require more than one iteration, and thus can cause delay in tapeout generation, especially if there is a time zone difference. If the foundry does not provide IP merge service on weekends and/or holidays, the delays may be even longer, regardless of the urgency of the project. Also, the foundry may charge the customer for its engineering services.

If the customer chooses to do the IP merge at the foundry's customer room, the customer must reserve the customer room. In some cases, the customer must wait because the customer room is not available. Depending on the locations of the foundry and the customer, the customer may have to incur travel expenses, and the person visiting the foundry to do the IP merge may lose time due to travel. The customer typically spends a great deal of time in the customer room during the IP merge operation. In some cases, the system processing time is large (e.g., hours), so that the customer may spend several days away from his or her normal job, doing nothing but the IP merge operation. Lastly, the foundry may charge the customer for the use of its room and/or computing resources.

An improved method and system for IP merge is desired.

SUMMARY OF THE INVENTION

An intellectual property (IP) merge system, comprising: a first storage device portion into which a user inputs integrated circuit (IC) configuration information by way of a network, a second storage device portion that stores cell library IP data, a graphical user interface server that serves at least one page by way of a network, the page enabling the user to request an IP merge operation based on the IC configuration information and the cell library IP data, and an IP server that performs the IP merge operation in response to the request by the user.

DESCRIPTION OF EXEMPLARY EMBODIMENTS OF THE INVENTION

Figure 1:
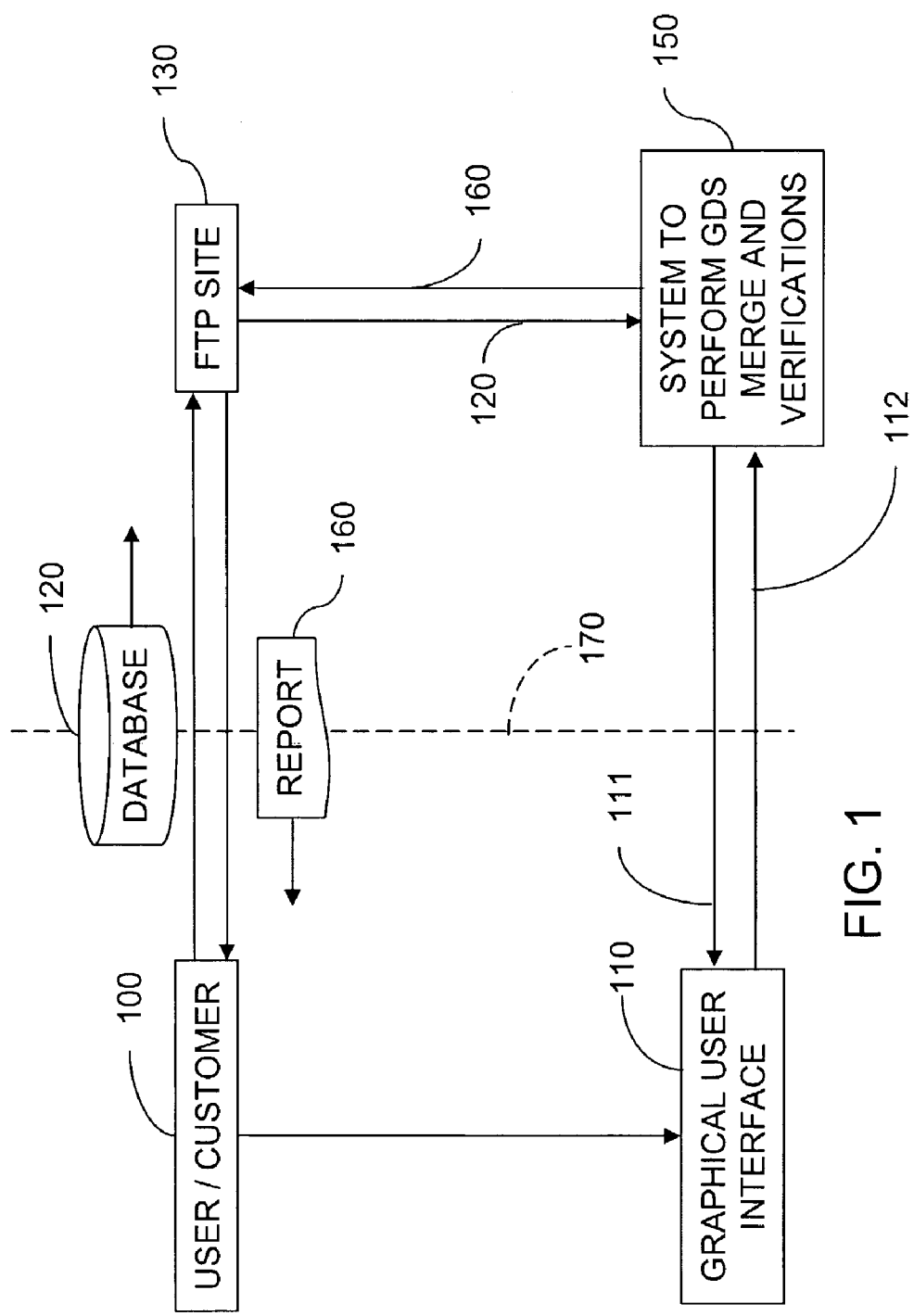
FIG. 1 is an exemplary IP merge system according to one embodiment of the invention.

FIG. 1 is a block diagram of an intellectual property (IP) merge system. A user (e.g., a customer of an IC foundry) accesses the system by way of a computer 100 or workstation connected to a network. The network may be a public network, such as the Internet, or it may be a private network owned or operated by the foundry. The user's computer or workstation has a graphical user interface 110. In a preferred embodiment, the user's computer has a web browser capable of receiving user interface display screens in the form of web pages 111 from a web server 200 (FIG. 2), and of transmitting user inputs 112 to the GDS merge and verification system 150. In a preferred embodiment, the user's computer 100 connects to the IP merge and verification system by way of the Internet.

A means is provided to make the user's GDS and SPICE netlist available (e.g., in a database 120) for the IP merge and verification. For example, a network accessible FTP site 130 may be provided for the user to upload this information. The information in the database 120 is accessed by the GDS merge and verification system 150, which outputs a report 160 for the user. The output report 160 of system 150 may be provided to the same FTP site 130, which is accessible by the user 100.

Preferably, the owner of system 150 implements a firewall 170 to prevent unauthorized access to or any malicious attack against the data in system 150 and FTP site 130. Any commercially available firewall may be used. In particular, the firewall allows the foundry or other operator of system 150 to ensure that the system 150 does not export the vendor's IP data.

Figure 2:
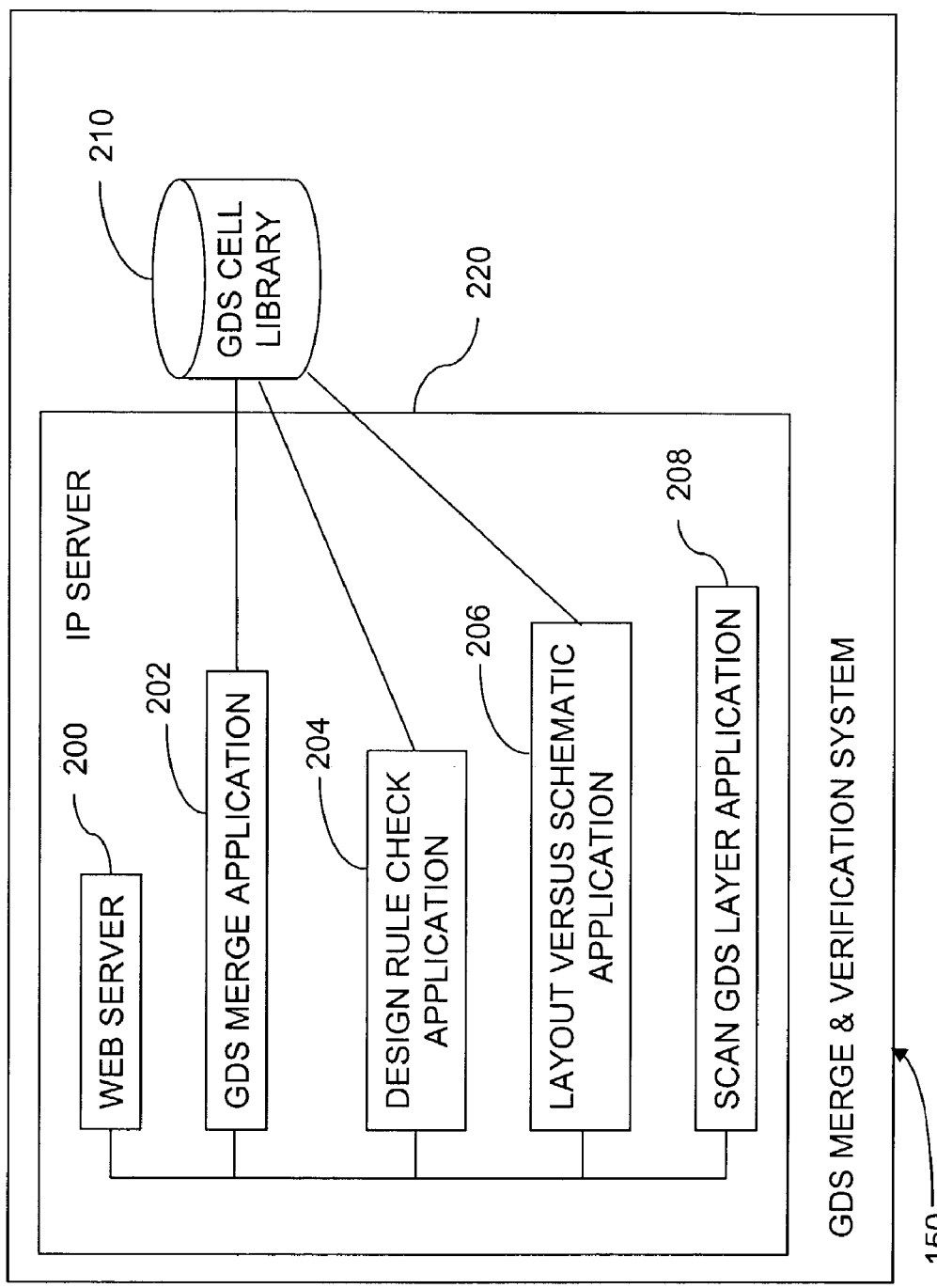
FIG. 2 is a block diagram of the GDS merge and verification block of FIG. 1.

FIG. 2 is a block diagram showing the GDS merge and verification system 150 of FIG. 1 in greater detail. System 150 may be implemented in a file server 220, a blade server, a workstation or other computer. The firewall 170 (not shown in FIG. 2) may run on the server 220. The system 150 has a web server 200 capable of rendering hypertext markup language (HTML) source code for displaying graphical user interface screens 110 in the browser of the user's computer 100. The web server 200 also receives commands and/or data from the user computer 100, and contains code to launch any of the remaining applications 202, 204, 206 and/or 208 in the system 150, in response to commands from the user.

A GDS merge application 202 is provided. Exemplary layout tools that can be used to perform the GDS merge include, but are not limited to: Virtuoso Layout Editor, or Virtuoso XL-Layout Editor from Cadence Design Systems of San Jose, Calif., or Laker by Springsoft Inc. of Taiwan.

A design rule check (DRC) application 204 is provided. Exemplary DRC tools may include, but are not limited to Calibre from Mentor Graphics Corp., Wilsonville, Oreg. or Hercules from Synopsys, Inc., Mountain View, Calif.

A layout versus schematic (LVS) tool 206 is provided. This capability may be integrated in the same package as the DRC application. For example, Calibre from Mentor Graphics, mentioned above, provides both DRC and LVS functionality.

A scan GDS layer application 208 is provided. This application traces the GDS structure and lists out the computer assisted design (CAD) layers included in the GDS. This function may be provided using a layout tool such as Laker by Springsoft Inc., mentioned above. In a preferred embodiment, a software module processes the scanned CAD layer information and generates a summary report to assist the user in preparing the tapeout document. The processing identifies whether there are any missing CAD layers or extra CAD layers after the IP merge operation. To accomplish this, the system module can compare the generated list of CAD layers from before IP merge GDS and after IP merge GDS to determine the difference. The report highlights to the user the presence of an extra layer or absence of a missing layer. Alternatively, the customer can get information for generating the tapeout document from the GDS streamout log.

The system 150 also has access to the GDS cell library 210. The cell library IP data may be stored in GDS II format, for example. The cell library 210 may be stored in the same server as the GDS merge and verification system 150, or it may be stored in a separate storage device to which the server hosting system 150 has access by way of a network, such as a local area network. Preferably, the firewall 170 prevents all user computers 100 from accessing the cell library 210.

Figure 3:
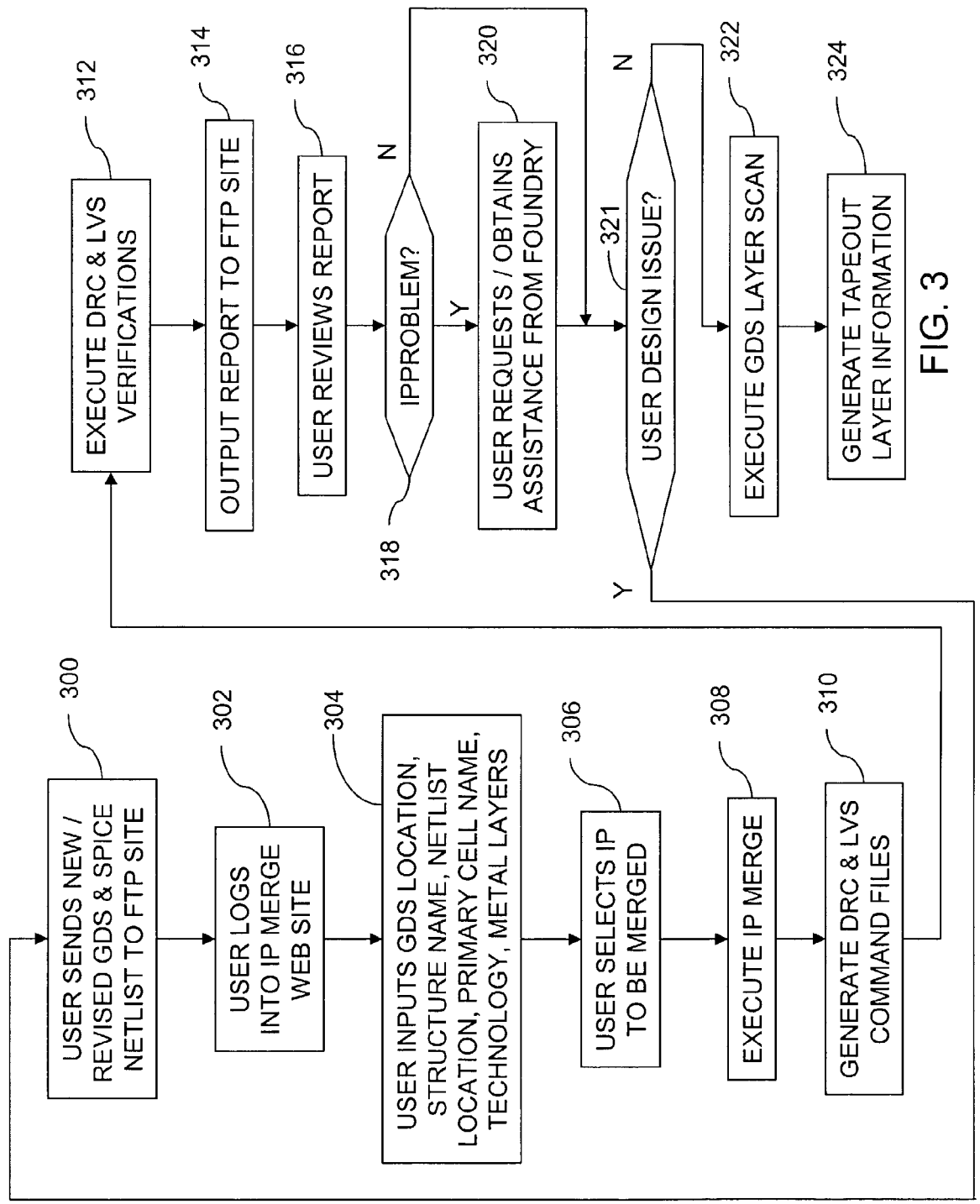
FIG. 3 is a flow chart of a method for performing IP merge and verification using the system of FIG. 1.

FIG. 3 is a flow chart of an exemplary method for intellectual property (IP) merge.

At step 300, the user sends the user's GDS and SPICE netlist to the FTP site 130.

At step 302, the user logs into the IP merge web site. The server 200 serves at least one graphical user interface (GUI) page 110 by way of a network (e.g., a public network, such as the Internet). The page 110 enables a user 100 to request an IP merge operation. The GUI page 110 prompts the user 100 to provide integrated circuit (IC) configuration information and cell identification data.

At step 304, the user inputs the GDS location (e.g., the FTP site), the structure name, the netlist location (e.g., the FTP site), primary cell name, process technology and metal layer numbers. The server 220 receives the IC configuration information and cell identification data from the user by way of the Internet (or other network).

At step 306, the user selects the IP to be merged. The server 220 receives the request for the IP merge operation from the user by way of the GUI page 110. The server 220 provides cell library IP data from cell library 210, corresponding to the cells identified by the user's cell identification data.

At step 308, the server 220 automatically performs the IP merge operation based on the IC configuration information and the cell library IP data.

At step 310, the server generates DRC/LVS command files based on the design information provided by the customer at step 304.

At step 312, the server 220 receives a request for design verification from the user by way of the GUI page 110 and automatically executes the requested design verification. The design verification includes at least one of the group consisting of design rule checks and layout versus schematic checks.

At step 314, the server 220 generates a report for the user and places the report on the FTP site.

At step 316, the customer reviews the report and decides if the final GDS is acceptable.

At step 318, if the user finds a problem or issue in the vendor's IP by reviewing the report, then step 320 is executed. If no problem with the vendor's IP is detected, then step 321 is executed next.

At step 320, the customer may request assistance from the foundry support engineer. In some embodiments, the GUI 110 provides a hypertext link to allow the user to easily generate an electronic mail message that is addressed to the foundry support engineer. In other embodiments, the user can enter a message into the IP merge system that is sent to a system administrator and saved in the IP merge system log. Alternatively, the user may call the engineer or administrator on the telephone. The foundry engineer handles the request and, if necessary, works with the IP vendor for resolution of the problem.

At step 321, if the report shows a problem in the customer's (i.e., the user's) design, the customer can revise the design and return to step 300. If there is no problem in the customer's design, step 322 is executed.

At step 322, if the customer accepts the final GDS, the customer requests a GDS layer scan by way of the GUI 110. Server 220 receives the request for the GDS layer scan from the user, and the scan GDS layer application 208 in server 220 automatically performs the requested GDS layer scan.

At step 324, the scan GDS layer application 208 generates tapeout information.

Figure 4:
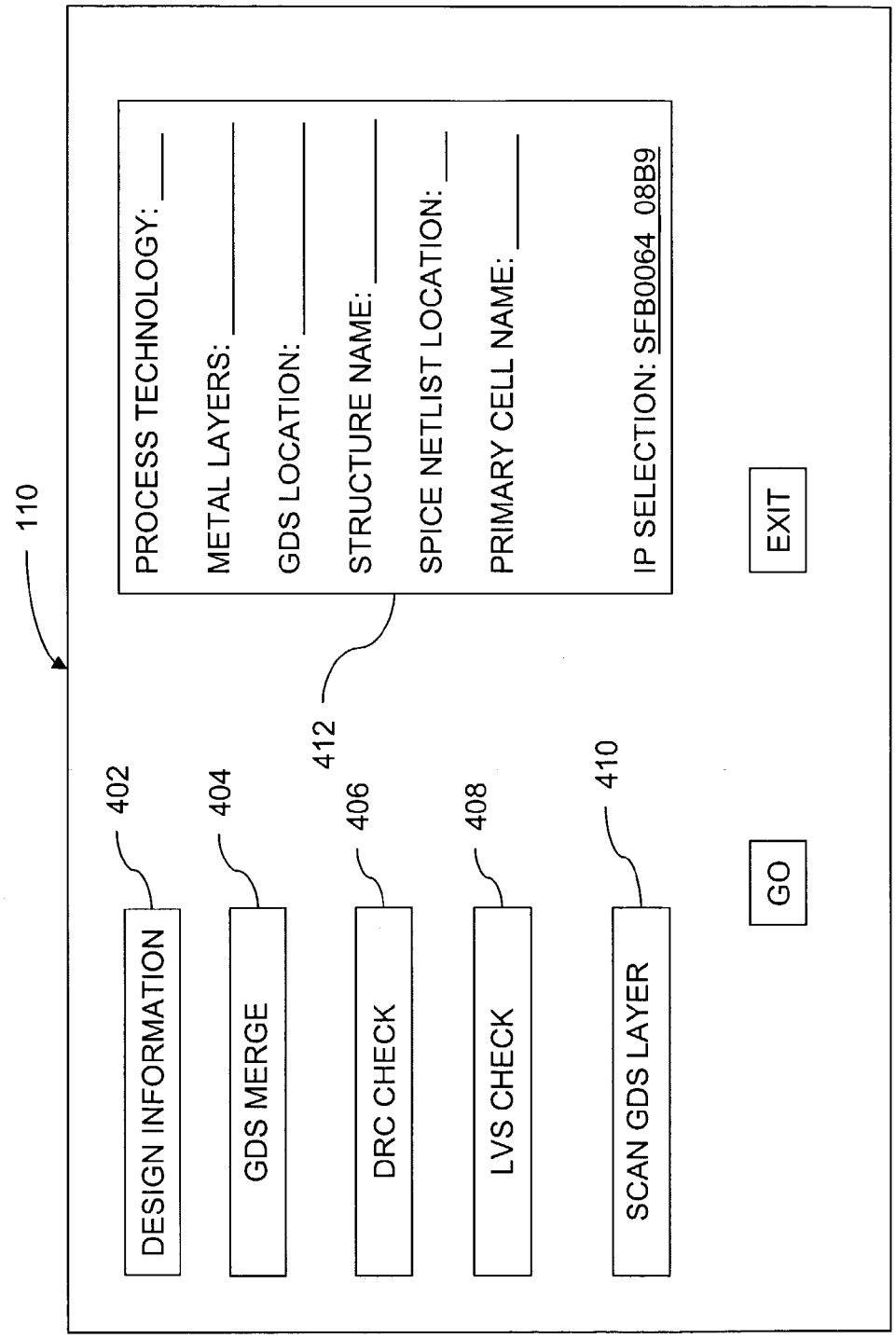
FIG. 4 is a diagram of the graphical user interface screen of FIG. 1.

FIG. 4 is a diagram of an exemplary display for GUI 110. Exemplary display 150 includes the following controls: a button 402 for obtaining the design information from the FTP site 130, a button 404 for requesting the GDS merge, a button 406 for requesting DRC check, a button 408 for requesting the LVS check, and a button 401 for requesting the scan GDS layer function and tapeout data generation. Although the exemplary controls are buttons, other controls such as radio buttons and/or checkboxes may be used.

GUI 110 also includes input fields 412 for inputting the process technology, metal layer numbers, GDS location, structure name, SPICE netlist location, primary cell name, and IP Selection (IP name and version).

Although the exemplary system of FIG. 1 has an FTP site 130 to which the user transfers the GDS and SPICE netlist, and to which the GDS merge and verification system 150 outputs its report, other input and output methods may be used. For example, the user may send the GDS and SPICE netlist data to the GDS merge and verification system 150 using transmission control protocol (TCP), user datagram protocol (UDP), or any other reliable data transfer mechanism. In addition to use of various protocols, the GDS and SPICE netlist can be delivered directly to the server 220, or to another host collocated with server 220, or to another host to which server 220 is connected by a network.

The example described above uses two physically separate storage devices with the user's GDS and SPICE netlist in a first physical storage device and the GDS cell library in a second physical storage device. In other embodiments, the first and second storage devices containing the GDS and SPICE netlist and GDS cell library may reside on different portions of the same physical storage device so long as appropriate security measures are taken to prevent unauthorized access to the GDS cell library. For example, the first and second storage device portions may be separate partitions of the same physical device, or firewall software can prevent any export of the GDS cell library.

The exemplary system allows a user, such as a foundry customer or designer, to perform IP merge operations any time, 24 hours a day, 7 days a week. There is no problem with a difference in time zones between the customer's site and the foundry. The customers do not need to wait for the availability of engineers or other personnel at the foundry in order to perform IP merge. The customers do not need to wait for the availability of the customer room at the foundry. The foundry does not need to allocate resources to performing IP merge or for supporting the customer room. Because the customer's designers can perform the IP merge from their own facility by way of a public network, it is easy for the designer to do other work while the IP merge software is executing. Because the foundry engineering resource use is reduced, customers can reduce their IP merge costs.

The exemplary system may be used for all types of IP for which the GDS data need to be merged, including but not limited to Flash IP, ARM core, or other mixed signal IP cores. The system can be used in any Foundry, or by any party who needs to provide an IP merge service.

Although the examples described above refer to the users as customers, the users may be any individuals having a need to perform an IP merge.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, ZIP™ disks, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An intellectual property (IP) merge system, comprising:
   a first storage device portion into which a user inputs integrated circuit (IC) configuration information by way of a network;
   a second storage device portion that stores cell library IP data;
   a graphical user interface server that serves at least one page by way of the network, the page enabling the user to request an IP merge operation based on the IC configuration information and the cell library IP data;
   an IP server that performs the IP merge operation in response to a request by the user; and
   a firewall that prevents the IP server from exporting the cell library IP data to the user.

2. The system of claim 1, wherein the second storage device portion stores the cell library IP data in GDS II format.

3. The system of claim 1, wherein the IP server performs design rule checks and layout versus schematic checks.

4. The system of claim 1, wherein the IP server performs a GDS layer scan to generate tapeout information.

5. The system of claim 1, wherein the page prompts the user to identify GDS cells and a SPICE netlist.

6. The system of claim 5, wherein the page further prompts the user to identify at least one of the group consisting of process technology, metal layers, structure name, primary cell name, and locations of files containing identification of the GDS cells and the SPICE netlist.

7. The system of claim 1, wherein the page includes controls that enable the user to select an operation from the group consisting of input design information, perform GDS merge, perform design rule check, perform layout versus schematic check, and scan GDS layer.

8. The system of claim 1, wherein the first storage device portion and the graphical user interface server are accessible by way of the Internet.

9. The system of claim 8, wherein the system allows the user to input IC configuration information to the first storage device portion using file transfer protocol.

10. The system of claim 1, further comprising a computer or workstation at a site of the user, the computer or workstation having a browser for displaying the at least one page, the site of the user being remote from a site of the IP server.

11. A method for intellectual property (IP) merge, comprising the steps of:

serving at least one graphical user interface (GUI) page by way of a network, the GUI page enabling a user to request an IP merge operation;

prompting the user by way of the GUI page to provide integrated circuit (IC) configuration information and cell identification data;

receiving the IC configuration information and cell identification data from the user by way of the network;

receiving a request for the IF merge operation from the user by way of the GUI page;

providing cell library IP data identified by the cell identification data;

automatically performing the IP merge operation using the cell library IP data; and preventing the IP sewer from exporting the cell library IP data to the user.

12. The method of claim 11, further comprising:

receiving a request for design verification from the user by way of the GUI page; and automatically performing the requested design verification.

13. The method of claim 12, wherein the design verification includes design rule checks and layout versus schematic checks.

14. The method of claim 11, further comprising:

receiving a request for a GDS layer scan from the user by way of the GUI page; and automatically performing the requested GDS layer scan and generating tapeout information.

15. The method of claim 11, wherein the GUI page further prompts the user to identify at least one of the group consisting of process terminology, metal layers, structure name, primary cell name, and locations of files containing identification of GDS cells and a SPICE netlist.

16. The method of claim 11, wherein the cell library IP data are stored at a site operated by an IC foundry, and the user is a customer of the IC foundry located at a user site separate from the site operated by the IC foundry.

17. A computer readable medium encoded with computer program code, wherein, when the code is executed by a processor, the processor performs a method for intellectual property (IP) merge, comprising the steps of:

serving at least one graphical user interface (GUI) page by way of a network, the GUI page enabling a user to request an IP merge operation;

prompting the user to provide integrated circuit (IC) configuration information and cell identification data;

receiving the IC configuration information and cell identification data from the user by way of the network;

receiving a request for the IP merge operation from the user by way of the GUI page;

providing cell library IP data identified by the cell identification data;

automatically performing the IP merge operation using the cell library IP data; and preventing the IP server from exporting the cell library IP data to the user.

18. The computer readable medium of claim 17, further comprising;

receiving a request for design verification from the user by way of the GUI page; and automatically performing the requested design verification.

19. The computer readable medium of claim 18, wherein the design verification includes rule checks and layout versus schematic checks.

20. The computer readable medium of claim 17, further comprising:

receiving a request for a GDS layer scan from the user by way of the GUI page; and automatically performing the requested GDS layer scan and generating tapeout information.

21. The computer readable medium of claim 17, wherein the GUI page further prompts the user to identify at least one of the group consisting of process technology, metal layers, structure name, primary cell name, and locations of files containing identification of GDS cells and a SPICE netlist.

* * * * *

UNITED STATES PATENT AND TRADEMARK OFFICE
CERTIFICATE OF CORRECTION

| | | |
|---|---|---|
| PATENT NO. | : 7,096,439 B2 | Page 1 of 1 |
| APPLICATION NO. | : 10/442769 | |
| DATED | : August 22, 2006 | |
| INVENTOR(S) | : Cheng Mao Tsai and Hung-Yih Hsieh | |

It is certified that error appears in the above-identified patent and that said Letters Patent is hereby corrected as shown below:

Column 7, line 9, delete "IF" and insert therefor -- IP --.

Column 7, line 15, delete "sewer" and insert therefor -- server --.

Column 7, line 32, delete "terminology" and insert therefor -- technology --.

Column 8, line 25, after "includes" insert --design--.

Signed and Sealed this

Seventeenth Day of July, 2007

JON W. DUDAS
*Director of the United States Patent and Trademark Office*